United States Patent [19]

Moriki et al.

[11] 4,054,806
[45] Oct. 18, 1977

[54] DRIVE CIRCUIT FOR PIEZOELECTRIC HIGH VOLTAGE GENERATING DEVICE

[75] Inventors: Juichi Moriki, Nishinomiya; Masayoshi Shioji; Teruo Itoh, both of Ibaragi, all of Japan

[73] Assignee: Matsushita Electric Industrial Co., Ltd., Osaka, Japan

[21] Appl. No.: 650,320

[22] Filed: Jan. 19, 1976

Related U.S. Application Data

[63] Continuation of Ser. No. 357,543, May 7, 1973, abandoned, which is a continuation of Ser. No. 228,112, Feb. 22, 1972, abandoned, which is a continuation-in-part of Ser. No. 88,515, Nov. 10, 1970, abandoned, which is a continuation of Ser. No. 752,672, Aug. 14, 1968, abandoned.

[30] Foreign Application Priority Data

Aug. 18, 1967 Japan .................. 42-53376

[51] Int. Cl.² .................. H01L 41/04
[52] U.S. Cl. .................. 310/318
[58] Field of Search .................. 310/8.1, 9.8; 318/116, 318/118

[56] References Cited

U.S. PATENT DOCUMENTS

| 2,975,354 | 3/1961 | Rosen | 310/8.1 X |
|---|---|---|---|
| 3,109,153 | 10/1963 | Rodek | 310/8.2 UX |
| 3,432,691 | 3/1969 | Shoh | 310/8.1 |
| 3,598,909 | 8/1971 | Sasaki | 310/8.1 |
| 3,668,486 | 6/1972 | Silver | 310/8.1 X |
| 3,681,626 | 8/1972 | Puskas | 310/8.1 |
| 3,683,210 | 8/1972 | Kawada | 310/8.1 |
| 3,691,410 | 9/1972 | Kawada | 310/8.1 |

Primary Examiner—Mark O. Budd
Attorney, Agent, or Firm—Stevens, Davis, Miller & Mosher

[57] ABSTRACT

A high voltage generating device utilizing a piezoelectric transformer in which an inductance is connected between one of the drive electrodes of the piezoelectric transformer and an output terminal of a drive signal source, and a capacitor is connected across the two drive electrodes so that a variation of the output voltage of the device due to a change in the load is minimized. In addition, the effective range of the frequency characteristic of the output voltage is expanded and the temperature characteristic of the output voltage is improved.

13 Claims, 21 Drawing Figures

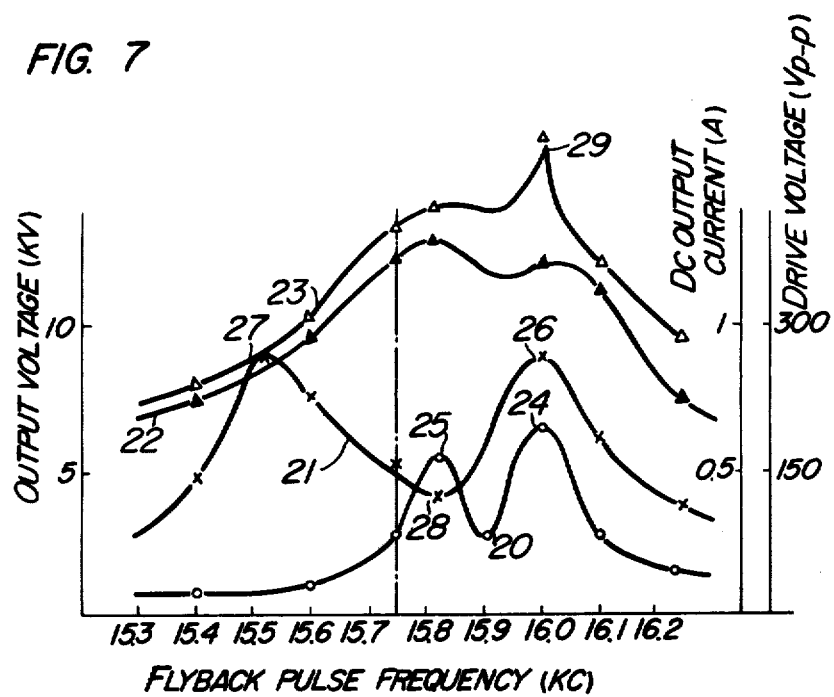
FIG. 7
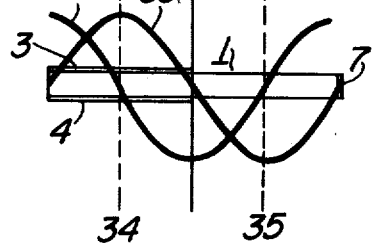
FIG. 8a
FIG. 8b

DRIVE CIRCUIT FOR PIEZOELECTRIC HIGH VOLTAGE GENERATING DEVICE

CROSS-REFERENCE TO RELATED APPLICATION

This is a continuation of Ser. No. 357,543, filed May 7, 1973, now abandoned, which was a continuation of Ser. No. 228,112, filed Feb. 22, 1972, now abandoned, which in turn was a continuation-in-part of Ser. No. 88,515, filed Nov. 10, 1970, now abandoned, which in turn was a continuation of Ser. No. 752,672, filed Aug. 14, 1968, now abandoned.

BACKGROUND OF THE INVENTION

1. Field of the Invention

This invention relates to an improvement in a high voltage generating device utilizing a piezoelectric transformer.

2. Description of the Prior Art

For example, a black-and-white television receiver requires a high voltage of the order of 10,000 to 15,000 volts to make the cathode-ray tube luminant. Conventional television receivers employ a flyback transformer for the generation of such a high voltage. The flyback transformer which is based on the principle of a winding-type transformer, has several thousands of turns of very fine copper wire having a diameter of the order of 0.1 mm wound around a ferrite core and has undergone an insulating process so as to withstand the above-mentioned high voltage. The flyback transformer, accordingly, is considerably complicated in shape and relatively large in size and weight.

Therefore, it is very desirable if the winding can be eliminated from such a transformer and a windingless flyback transformer provided. To meet such a demand, a novel principle had to be exploited which replaces the conventional voltage conversion method based on the principle of electric-to-magnetic-to-electric energy conversion.

With the advent of ceramic piezoelectric materials, a novel idea has been conceived which utilizes the piezoelectric effect of such a material to achieve the desired voltage conversion by means of an electric-to-mechanical-to-electric conversion of energy, finally leading to the development of the piezoelectric transformer.

A piezoelectric transformer was first proposed by C. A. Rosen et al who applied for a patent in 1954 and was granted the patent in 1958 (see U.S. Pat. No. 2,830,274). C. A. Rosen et al. described the piezoelectric transformer as an outstandingly useful means for generating a high voltage. Since then, however, no further practical development has been seen in the field of the piezoelectric transformer other than verificaton tests and theoretical analysises of the principle, because of various technical problems still to be overcome.

SUMMARY OF THE INVENTION

It is the principle purpose of the present invention to solve such various technical problems and to provide a high voltage generating device especially suitable for the use with television receivers utilizing such a piezoelectric transformer.

Therefore, a primary object of the present invention is to reduce variation of the output voltage of a piezoelectric transformer due to variation of the load.

A second object of the present invention is to extend the band width of the output frequency of the piezoelectric transformer.

A third object of the present invention is to improve the temperature characteristics of the output voltage (drop of the output voltage due to rise of temperature) of the piezoelectric transformer.

A fourth object of the present invention is to provide means for supporting the piezoelectric element securely.

Other objects and features of the present invention will become clear in the following description of the present invention which is given with reference to the attached drawings.

BRIEF DESCRIPTION OF THE DRAWINGS

FIG. 7 is a diagram showing relations between flyback pulse frequency and output voltage of the circuits shown in FIGS. 1 and 2.

FIGS. 8a and 8b are diagrams showing the modes of resonance of the piezoelectric transformer.

FIG. 12 is an isometric view of a high voltage generating device incorporating the piezoelectric transformer shown in FIG. 10a.

DESCRIPTION OF THE PREFERRED EMBODIMENTS

Figure 1:
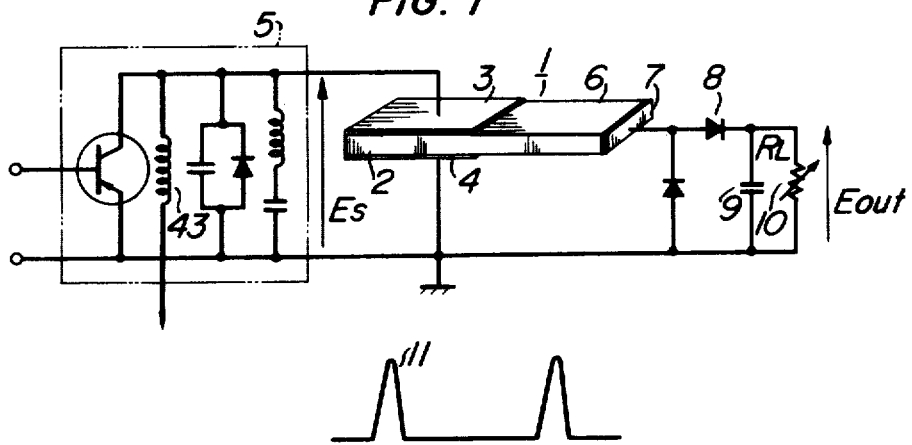
FIG. 1 is a circuit diagram of a conventional high voltage generating device utilizing a piezoelectric transformer.

Now, referring to FIG. 1 which shows a circuit diagram of a conventional high voltage generating device used in a television receiver, piezoelectric element 1 is made of a piezoelectric ceramic material such as barium titanate, PZT ceramics or PCM ceramics (for example, a ceramic essentially consisting of Pb $(Mg_{1/3} Nb_{2/3}) O_3$, $PbTiO_3$ and $PbZrO_3$). Driver section 2 of said element 1 is provided with electrodes 3 and 4 on the opposite surfaces and is polarized in the direction of thickness. Generator section 6 of the element 1 has an electrode 7 on the end face and is polarized in the longitudinal direction. Said electrodes 3 and 4 of the driver section 2 are connected to the horizontal output circuit 5 of the television receiver. On the other hand, said electrode 7 of the generator section 6 is connected to resistive load 10 and smoothing capacitor 9 through diode rectifier 8.

Operation of the above-described high voltage generating device will be explained hereunder. Flyback pulses 11 from the horizontal output circuit 5 applied to the electrodes 3 and 4, are converted from an electric energy to a mechanical energy by the electrostrictive effect thereby causing the whole body of the piezoelectric element 1 to mechanically vibrate; and a resonant vibration is generated along the length of the element 1 at a frequency depending on the length and the intrinsic propagation velocity of the vibration in the material of the element, thus a standing wave distributions of amplitude of stress and strain are established. The thus amplified strain in the generator section 6 of the element 1 produces a high potential difference between the electrode 7 and ground by the piezoelectric effect. Upon such a principle, a considerably highly stepped-up AC voltage can be obtained. This AC voltage is rectified through the diode 8 and smoothed by the capacitor 9, and a high DC voltage is applied across the resistive load 10. In fact, however, such a conventional device has not yet been brought into practical use because of various problems to be solved, as mentioned above.

In the following several paragraphs, such problems will be discussed with the aid of the drawings.

Figure 3:
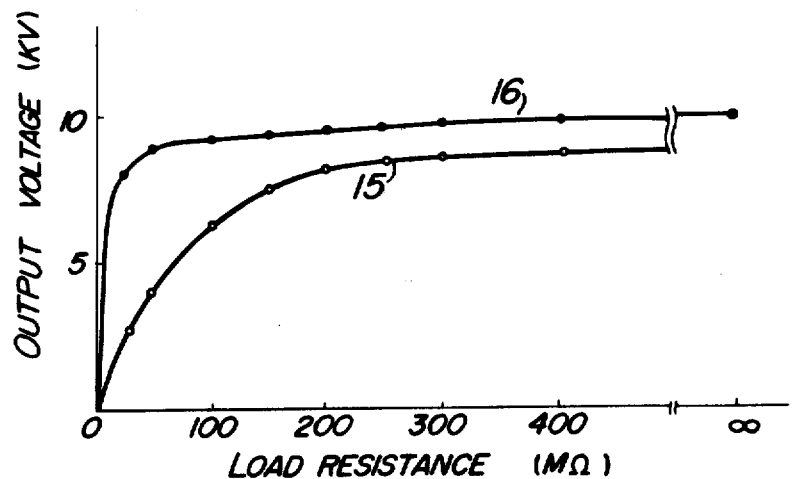
FIG. 3 is a diagram showing the output vs load characteristics of the circuits shown in FIGS. 1 and 2.

In FIG. 3, curve 15 is an example of the characteristic curve indicating the relation between the DC ouptut voltage and the load resistance in the conventional high voltage generating device as shown in FIG. 1. As shown in the figure, the oridinate of the chart indicates DC output voltage applied across the resistive load 10, while the abscissa indicates electric resistance of the load 10. Said resistive load 10 is the electric resistance between anode and cathode of a cathode-ray tube in a television receiver, and said resistance will vary over a range from 50 Meg-ohms to an infinitely high value according to the brightness of the picture or the amount of the beam current. With such variation in the load resistance, the output volage changes over a range from 10 kV to 3.6 kV which corresponds to about 36% of the maximum value of the output voltage, resulting in a corresponding variation in the width of the picture image frame. For this reason, the conventional piezoelectric high voltage generating device could not be used in a television receiver. That is, such a considerably high variation of the output voltage against variation of the load is one of the various disadvantages of the conventional device.

Next, referring to FIG. 7, curve 20 indicates a frequency characteristic of the output voltage in the conventional device as shown in FIG. 1. In the figure, the ordinate indicates the DC output voltage across the resistive load 10, while the abscissa indicates the frequency of the flyback pulse. As is seen from the diagram, the available frequency band is very narrow, the frequency band corresponding to 50% drop of the output voltage being within a range of about 350 c/s. Accordingly, if the resonant frequency of the piezoelectric transformer varies due to a rise of temperature or gradual change of characteristics, the output voltage will drop rapidly. Further, if the flyback pulse frequency deviates from its normal value, the high voltage will not be generated and the raster will not appear on the screen. Thus, the extreme narrowness of the operative frequency band is another disadvantage of the conventional device.

Figure 9:
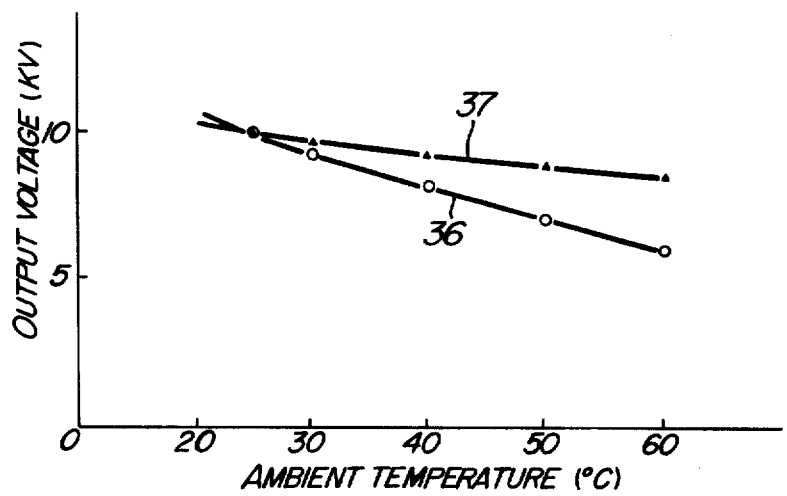
FIG. 9 shows temperature characteristics of the circuits shown in FIGS. 1 and 2.

Further, referring to FIG. 9, curve 36 shows a temperature characteristic of the output voltage in the conventional high voltage generating device as shown in FIG. 1. In the diagram, the ordinate indicates the DC output voltage across the resistive load 10, while the abscissa indicates ambient temperature. As is seen from the figure, the output voltage drops as much as 40% when the ambient temperature changes from 25° C to 60° C. This effect of the temperature cannot be avoided in existing piezoelectric ceramics, as it is attributed to temperature characteristics of the mechanical Q, that is, Qm of the piezoelectric material. Thus, the drop of the output voltage due to rise of temperature is another disadvantage of the conventional device.

Figure 2:
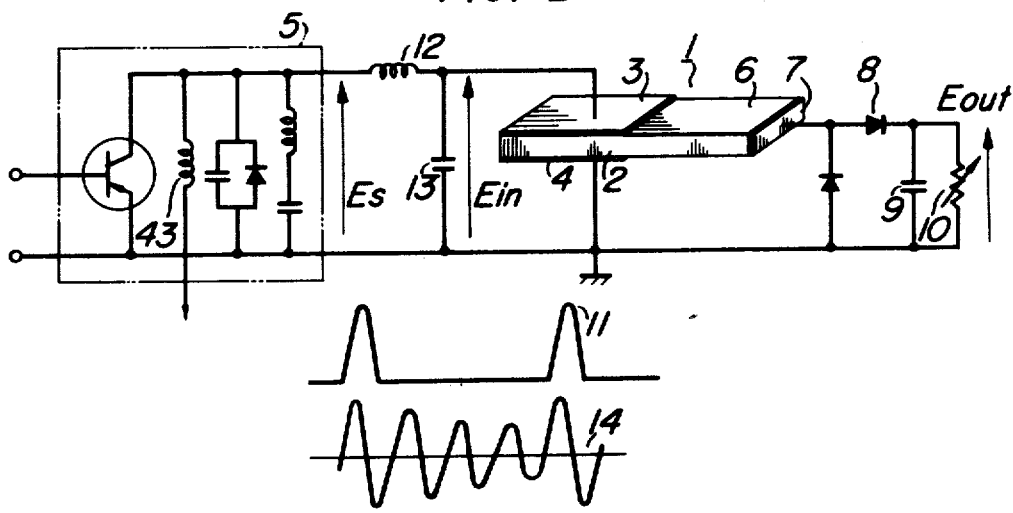
FIG. 2 is a circuit diagram of an embodiment of the high voltage generating device of the present invention.

FIG. 2 shows the circuit diagram of an embodiment of the present invention which is intended to remove the above-described three major disadvantages of the conventional devices, that is, to improve the load characteristics, frequency characteristics and temperature characteristics of the piezoelectric transformer.

The circuit shown in FIG. 2 differs from the circuit of the conventional high voltage generating device shown in FIG. 1, by the insertion of an inductor 12 between one output terminal of the horizontal output circuit 5 and the driving electrode 3 of the piezoelectric transformer 1, and further by the insertion of a capacitor 13 across the two driving electrodes 3 and 4.

As the result of such a modification, the load characteristic of the output voltage is remarkably improved, the variation in the output voltage being only 10% when the load resistance changes from an infinitely high value to 50 Meg-ohms, as shown by curve 16 in FIG. 3.

The frequency characteristic of the output volage also is remarkably improved as indicated by curve 22 in FIG. 7, the frequency band corresponding to 50% drop of the output voltage being 850 c/s. It will be noted that the output voltage per se is greatly increased at the same time.

Further, the temperature characteristic of the output voltage also is much improved, the drop of the output voltage at 60° C being only 14% as shown by curve 37 in FIG. 9.

Figure 4:
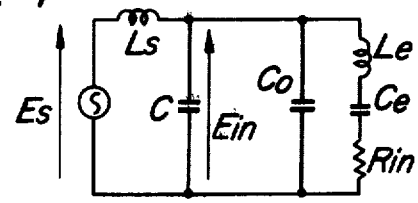
FIG. 4 shows an equivalent circuit for explaining the essential part of the circuit shown in FIG. 2.

The reasons why such remarkable effects are caused by the above-mentioned constitution of the circuit, will be qualitatively described hereunder. First, the effects on the load characteristic will be discussed. The circuit shown in FIG. 2 can be represented by the equivalent circuit shown in FIG. 4 in the vicinity of the resonant frequency, where reference mark $L_S$ represents the inductance value of the inductor 12 and mark C represents the static capacity of the capacitor 13. Mark $C_0$ is the static capacity between the two driving electrodes 3 and 4 of the piezoelectric transformer 1, and $L_e$, $C_e$ and $R_{in}$ are respectively the equivalent input resonant inductance, capacity and resistance of the piezoelectric transformer. Though the drive voltage for the circuit of FIG. 2 is flyback pulses as shown by reference numeral 11, it is assumed for simplifications' sake that a sinusoidal voltage $E_s$ of a single harmonic component of the flyback pulses is applied as the driving signal in the equivalent circuit of FIG. 4.

If the voltage applied across the driving electrodes 3 and 4 is indicated by $E_i$, then the voltage $E_i$ is determined by the following formula.

$$E_i = \frac{1}{j\omega L_s + \frac{1}{j\omega C_s + \frac{1}{Z}}} \times \frac{1}{j\omega C_s + \frac{1}{Z}} \times E_s \quad (1)$$

$$= \frac{E_s}{\frac{j\omega L_s}{Z} - \omega^2 L_s C_s + 1}$$

where $Z = j\omega L_e + \frac{1}{j\omega C_e} + R_{in}$ (2)

$$C_s = C + C_O$$

Choosing the values of $C_s$ and $L_s$ so as to fulfil the following requirement, $$\omega = \omega_O = 1/\sqrt{C_s L_s} = 1/\sqrt{L_e C_e} \ldots \quad (3)$$

Then, the voltage $E_i$ at an angular frequency $\omega_o$ is given as follows.

$$E_i = \frac{E_s Z}{j\omega_O L_s} = -jE_s C_s R_{in} \omega_o \quad (4)$$

That is, the voltage $E_i$ is proportional to $E_s$, $C_s$, $\omega_O$ and $R_{in}$.

On the other hand, it is well known in the characteristics of a piezoelectric transformer that $R_{in}$ increases as the load resistance $R_L$ decreases, unlike in ordinary transformers. An example of such characteristics in shown in FIG. 5 as curve 17.

Figure 5:
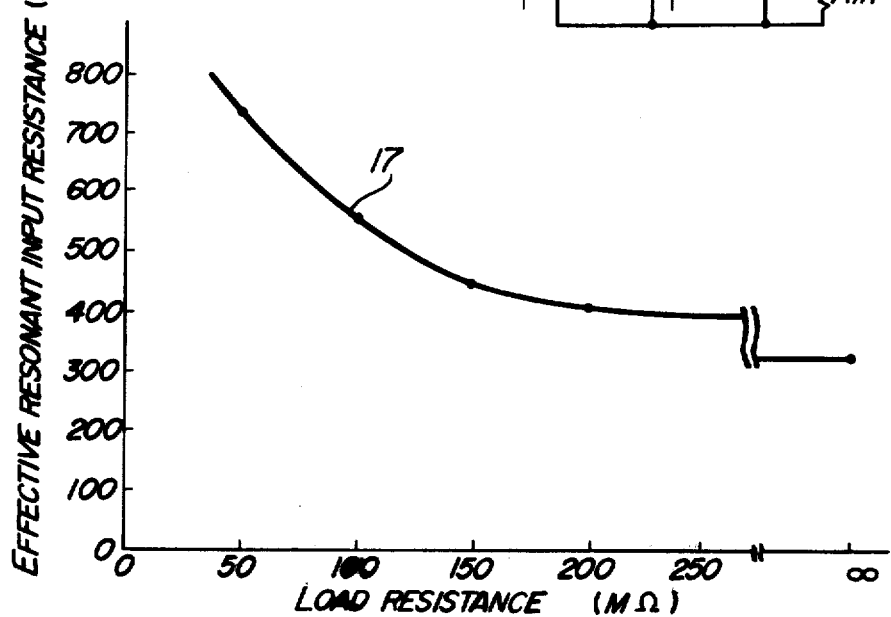
FIG. 5 is a diagram showing a relation between load resistance and effective resonant input resistance of the piezoelectric transformer.
Figure 6:
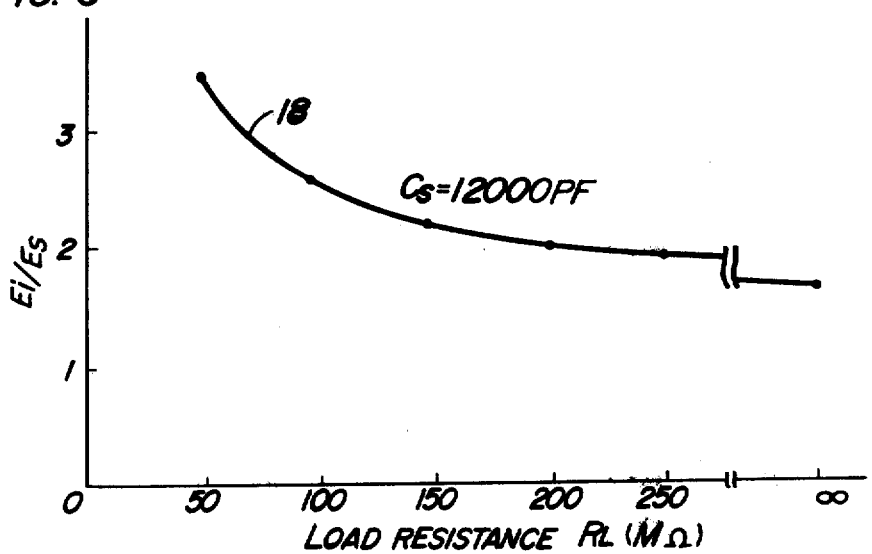
FIG. 6 is a diagram showing a relation between load resistance and voltage ratio between output voltage of a drive signal source and input voltage of the piezoelectric transformer contained in the device of the present invention.

Therefore, it will be clear from the above formula (4) and the relation shown in FIG. 5 that the voltage $E_i$ increases as $R_L$ decreases. FIG. 6 shows examples of the above relation, in which curve 18 shows the relation of $E_i/E_s$ to the load resistance $R_L$ when $C_s$ is 12,000 pF (that is, $C_O = 2,000$ pF and $C = 10,000$ pF). As is seen from curve 18, $E_i/E_s$ increases as the load resistance $R_L$ decreases, the ratio being 1.85 when $R_L$ is infinitely high, but 3.7 when $R_L$ is 50 Meg-ohms. This relation serves to compensate the load characteristics of the piezoelectric element per se according to which the output tends to decrease when $R_L$ decreases as shown by curve 15 in FIG. 3. As the result of the combination of two opposite characteristics, a satisfactory load characteristic as indicated by curve 16 in FIG. 3 is obtained.

Next, the effects of the circuit of the present invention on the improvement of the frequency characteristic, will be discussed. FIG. 7 is a diagram for explaining this improvement. In FIG. 7, curve 20 which indicates the relation between the DC output voltage and the flyback pulse frequency in the conventional circuit shown in FIG. 1 without the inductor 12 and capacitor 13 as described previously, generally has two resonant peaks 24 and 25. Resonant peak 24 is due to the λ/2 mode resonance (a resonance mode in which a half wavelength of the standing wave is established over the full length of the element) as shown in FIG. 8a, and the resonant frequency can be chosen as desired by adjusting the length of the piezoelectric element from among frequencies which are harmonics of the flyback pulse frequency. However, the most satisfactory length of the element is one that resonates in the λ/2 mode with the second higher harmonic of the flyback pulse frequency or in the λ mode with the fourth higher harmonic of the flyback pulse frequency, in view of the following conditions;

1. No audible vibration noise is produced;
2. Sufficient output is provided;
3. No insulation breakdown will occur in the voltage generating portion;
4. Size is small; and
5. The piezoelectric element will not be overheated.

On the other hand, resonant peak 25 is due to the λ mode resonance as shown in FIG. 8b, and the resonant frequency is twice that frequency in the λ/2 mode resonance. The flyback pulse frequencies that cause the λ/2 mode and λ mode resonances will coincide with each other, if the following conditions hold good;

1. Propagation velocity of the vibration is uniform in every part of the piezoelectric element;
2. The propagation velocity does not vary with frequency; and
3. Mechanical characteristic impedances in the driven portion and the generator portion of the element are in exact coincidence.

In fact, however, as such conditions are not always fulfilled generally, curve 20 has two resonant peaks 24 and 25 as shown. Therefore, it should be determined which mode out of the two is to be used for the generation of the high voltage. It will be concluded that the λ mode is preferable in view of the following conditions;

1. The load characteristics of the output voltage is improved;
2. Reactor 12 can be smaller;
3. Node of stress is at the boundary of the driver portion and the generator portion. (Strength of the element is comparatively weak at the vicinity of the boundary, as the directions of polarization are crossing each other thereat.)

Therefore, the following explanation will be made of an example in which the piezoelectric element is designed so as to resonate in the λ mode with the fourth harmonic of the flyback pulse frequency.

If the flyback pulse repetition frequency which resonates in the λ mode as shown by curve 20 in FIG. 7 is assumed to be 15.84 kC, the λ mode resonant frequency becomes 15.84 kC × 4, that is 63.36 kC.

Accordingly, if values of $C_s$ and $L_s$ are chosen so that the following requirements is satisfied (see formula (3)), $$63.36 \times 10^3 = \frac{1}{2\pi\sqrt{C_s L_s}} \quad (3)'$$

the voltage imposed across the two driving electrodes 3 and 4 is deprived of a considerably part of the components other than the fourth harmonic of the pulse frequency and becomes nearly a sinusoidal voltage having a frequency of four times the flyback pulse frequency as indicated by numeral 14 in FIG. 2. In this case, as shown by curve 21 in FIG. 7, the frequency characteristic curve of the voltage imposed across the two driving electrodes has a minimum point 28 at the vicinity of the λ mode resonant pulse frequency and a maximum point 26 or 27 at each side of said minimum point 28. Existence of such a characteristic can be easily proved by studying the relation between $E_i$ and $\omega$ in formula (1).

Thus, superimposition of the characteristic of the curve 21 (having the maximum points 26, 27) on the characteristic of the curve 20 (having the maximum point 25 in a mode resonance) will give a sufficiently flat frequency characteristic over an extended frequency band as indicated by curve 22, as in a stagger amplifier.

Next, the compensating effect by the circuit of the present invention on the temperature characteristic as shown in FIG. 9, will be explained. In the existing ceramics, the mechanical Q or $Q_m$ vary with temperature, $Q_m$ decreasing as the temperature rises. As the step-up ratio of the piezoelectric transformer is proportional to $Q_m$, the output voltage drops with a rise of temperature as shown by curve 36 in FIG. 9. It is a well known fact the drop of $Q_m$ increases the equivalent resistance $R_{in}$ shown in FIG. 4. In turn, increase of the resistance $R_{in}$ increases the voltage $E_i$ which is imposed across the driving electrodes. Thus, the temperature characteristic can be remarkably improved as shown by the curve 37 in FIG. 9, the drop in the step-up ratio of the piezoelectric transformer being compensated by the rise in the voltage $E_{in}$ to be applied across the driving electrodes.

As described above, it will be clear that the addition of the inductor 12 and the capacitor 13 according to the present invention gives outstanding effects for the improvement of the load, frequency and temperature characteristics of the output voltage of the piezoelectric transformer.

However, these effects cannot be obtained by simply satisfying the formula (3) and various other conditions must be met simultaneously. These additional conditions constitute very important factors for the present invention. Thus, to define these conditions, an explanation will be given hereunder according to the results of a more precise analysis.

Figure 13:
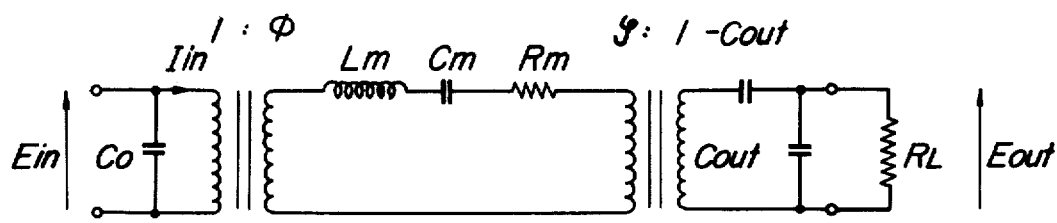
FIG. 13 shows a complete equivalent circuit of the piezoelectric transformer used in the device of the present invention.

FIG. 13 shows a complete equivalent circuit of the piezoelectric transformer. With this circuit, the output volage $E_{out}$ expressed in terms of the input current $I_{in}$ to the mechanical circuit is given by the following formula:

$$E_{out} = \frac{k_{33}}{j\omega k_{31}(1-k_{33}^2)^{\frac{1}{2}}} \sqrt{\frac{Y_3^D}{Y_1^E}} \frac{1}{\epsilon_{33}^T W} I_{in} \quad (5)$$

where $\omega$ is an arbitrary angular frequency, and each symbol of FIG. 13 is explained as follows.

$E_{in}$ = input voltage
$I_{in}$ = input current to mechanical circuit
$E_{out}$ = output voltage
$R_L$ = load resistance
$C_O = E_{33}^T(1-k_{31}^2)\ WT/L$
$C_{out} = E_{33}^T(1-k_{33}^2)\ WT/L$
$\phi = W d_{31}\ Y_1^E$ $\phi = \frac{k_{33}^2}{g_{33}} \frac{Y_1^E}{Y_3^D} \frac{WT}{L}$ $L_m = \frac{1}{8} L\rho WT$
$C_m = 4L/\pi^2 Y_1^E WT$
$R_m = \pi WT(\pi Y_1^E)^{1/2}/4\ Q_m$
$2L$ = length of piezoelectric transformer in meters
$W$ = width of piezoelectric transformer in meters
$T$ = thickness of piezoelectric transformer in meters
$\rho$ = mass per unit volume in kilograms per cubic meter $Y_1^E$ = Youngs modulus under a constant electric field in the longitudinal direction, in Newtons per square meter $Y_3^D$ = Youngs modulus in the longitudinal direction measured with constant dielectric flux density, in Newtons per square meter $d_{31}$ = ratio between strain in longitudinal direction and electric field strength in vertical direction under constant stress in the longitudinal direction, in meters per volt $g_{33}$ = ratio between longitudinal strain and charge density under constant longitudinal stress in square meters per coulomb $k_{31}$ = electro-mechanical coupling coefficient with the direction of the electric field and the direction of movement of the transformer being normal to each other $k_{33}$ = electro-mechanical coupling coefficient with the direction of the electric field and the direction of movement of the transformer being parallel to each other $\epsilon_{33}^T$ = dielectric constant in farads per meter measured under constant stress $Q_m$ = mechanical Q of the piezoelectric material In formula (5), if the value of $I_{in}$ is maintained constant, then the variation of the output voltage with variations in the load can be reduced to zero since the output voltage is independent of the load resistance $R_L$. On the other hand, with the value of $I_{in}$ being maintained constant, the frequency characteristic of the output voltage can be considered to take practically a flat form since it is only inversely proportional to the angular frequency $\omega$. The temperature characteristic of the output voltage can also be improved considerably, since the output voltage is now independent of the mechanical Q, i.e. $Q_m$ whose temperature characteristic is a significant one. It is thus evident that the aforesaid difficulties can be overcome to a considerable extent, if the input current to the mechanical circuit is maintained constant. The circuit shown in FIG. 2 is a first embodiment of the invention incorporating such a concept. In other words, by providing the series-connected inductor 12 and the parallel-connected capacitor 13, variation in the value of $I_{in}$ with variations in the load, frequency or temperature is minimized to thereby improve the load characteristic, frequency characteristic or temperature characteristic of the output voltage.

Figure 14:
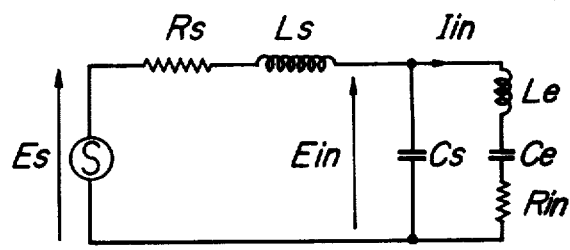
FIG. 14 shows a more precise equivalent circuit to replace the circuit of FIG. 4.

Now consider the matter from the point wherein by what method the variation of $I_{in}$ with variations in the load, frequency or temperature can be minimized. FIG. 14 illustrates a more exact equivalent circuit of the circuit shown in FIG. 4. In FIG. 14, $R_s$ represents the sum of the internal resistance of the signal source 5 and the internal resistance of the inductor 12. In FIG. 14, the values of $L_s$ and $C_s$ are chosen, so that $$\frac{1}{\sqrt{L_s C_s}} = \frac{1}{\sqrt{L_e \frac{C_e C_s}{C_e + C_s}}} = \omega_O \quad (6)$$

In this case, the absolute value $|I_n|$ of the input current $I_{in}$ to the mechanical circuit is given by the following formula:

$$|I_{in}| = \frac{E_s}{\omega_O L_s \sqrt{\frac{16}{k^4} r^4 + 8 \frac{(1-\gamma^2)}{\gamma^2 k^2} r^2 + (1 + \frac{1}{QQ_{eff} k^2}) r^2}} \quad (7)$$

where $r$ = relative frequency deviation from $\omega_0$, i.e.
$r = (\omega - \omega_0)/\omega_0$, where $\omega$ is an arbitrary given angular frequency $$Q = \omega_0 L_s/R_s \qquad (8)$$

$$Q_{eff} = \omega_0 L_e/R_{in} \qquad (9)$$

$$k^2 = L_s/L_e \qquad (10)$$

$$\gamma^2 = \frac{2Q^2 Q_{eff}^2 k^2}{Q^2 + Q_{eff}^2} \qquad (11)$$

In formula (7), if $\omega = \omega_0$, i.e. $r = 0$, then the input current $|I_{in}|$ $r=0$ to the mechanical circuit is given as follows:

$$|I_{in}|_{r=0} = \frac{E_s}{\omega_0 L_s(1 + \frac{1}{QQ_{eff}k^2})} \qquad (12)$$

In the formula (12), it is only $Q_{eff}$ that varies with the load resistance $R_L$. Thus, the value $|I_{in}|r=0$ can be made substantially independent of the load resistance $R_L$ and hence the load characteristic of the output voltage can be improved considerably, if the circuit constants are chosen, so that $$1 >> 1/QQ_{eff}k^2 \qquad (13)$$

Figure 15:
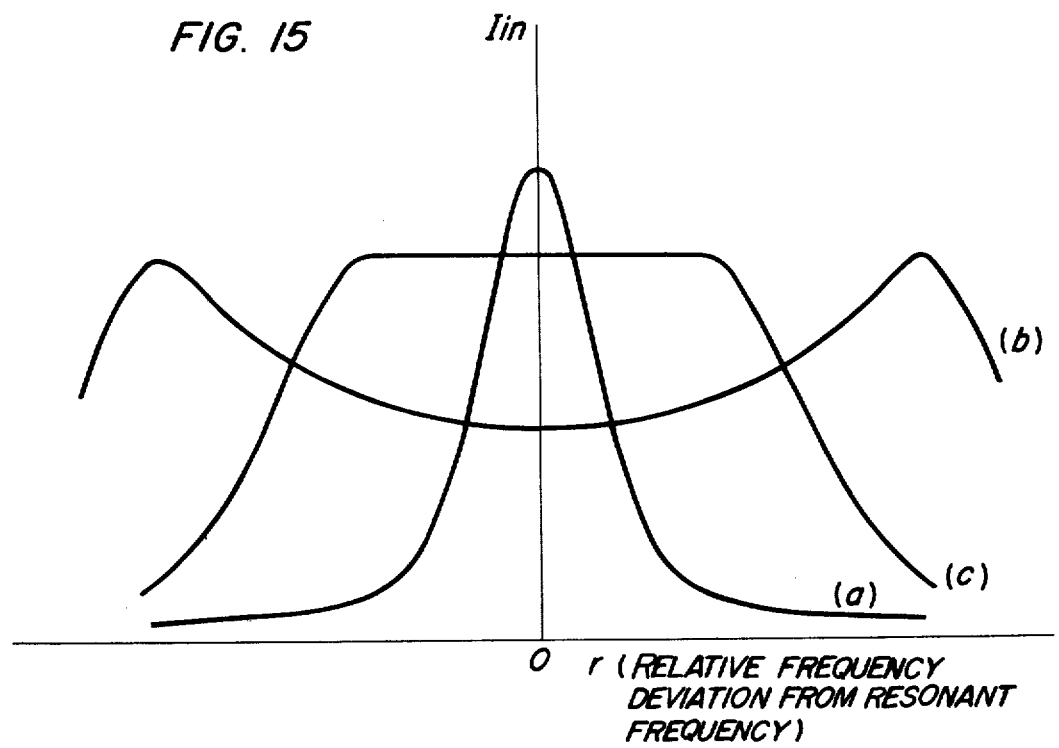
FIG. 15 is a diagram showing three different frequency characteristics of the input current to the piezoelectric transformer mechanical circuit.

On the other hand, as will be seen from formula (7), the frequency characteristic of the input current $I_n$ can assume various forms depending on the value of $\gamma^2$. In other words, if $\gamma^2 < 1$, then the frequency characteristic takes the form of a single-humped characteristic as shown by the curve (a) in FIG. 15, which rises abruptly. If $\gamma^2 > 1$, then as shown by the curve (b) in FIG. 15 the frequency characteristic takes the form of a double-humped characteristic having a depression at the center and thus failing to provide a flat frequency characteristic, although its band width is widened. On the other hand, if $\gamma^2 = 1$, then as shown by the curve (c) in FIG. 15 a critical coupling condition results and thus the frequency characteristic takes a flat form with a wide band width. Ideally, therefore, the circuit constants should be selected so that the condition $\gamma^2 = 1$ holds. In practice, however, a flat and wide frequency characteristic which can be well put into practical use is obtainable, if the following relation is satisfied:

$$0.5 < \gamma^2 < 2 \qquad (14)$$

As for the temperature characteristic of the output voltage, only $\epsilon_{33}{}^T$ and $Q_{eff}$ have significant temperature characteristics in the formula (12). However, if the formula (13) holds, then the input current $I_{in}$ and the output voltage become independent of $Q_{eff}$. Therefore, the temperature characteristic of the output voltage is dependent on the temperature characteristic of $\epsilon_{33}{}^T$. Since the temperature characteristic of $\epsilon_{33}{}^T$ is better than that of $Q_{eff}$, the temperature characteristic of the output voltage can be improved greatly.

Figure 16:
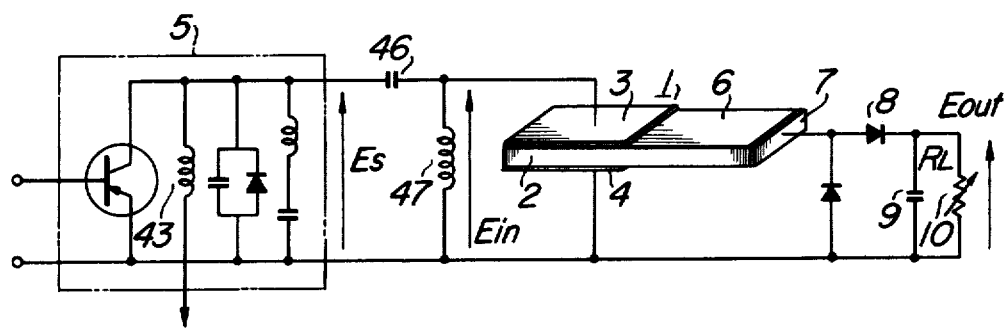
FIG. 16 is a circuit diagram of another embodiment of the present invention.
Figure 17:
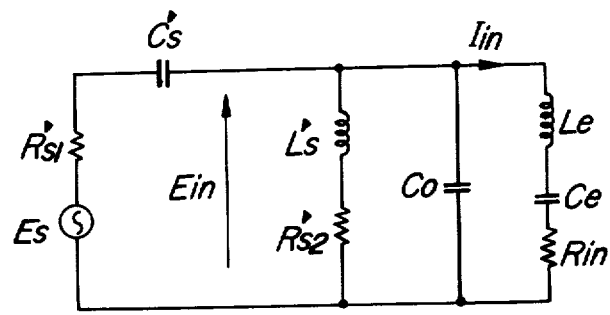
FIG. 17 shows an equivalent circuit of FIG. 16 in which the piezoelectric transformer is substituted by the equivalent input impedance.

Referring to FIG. 16, there is shown another embodiment of the present invention. In the figure, numeral 46 designates a capacitor and numeral 47 designates an inductor. FIG. 17 illustrates an equivalent circuit of the circuit shown in FIG. 16 in which the piezoelectric transformer is represented by the equivalent input impedance. In FIG. 17, $r_{s'}$ is the equivalent internal resistance of the signal source 5, $C_s'$ is the capacitance value of the resonant capacitor 46, $L_s'$ is the inductance value of the resonant inductor 47, and $R_{s2}'$ is the internal resistance of the resonant inductor 47. Now assume that the values of $L_s'$ and $C_s'$ in FIG. 17 are chosen so that when the value of $L_s'$ is selected to be sufficiently small to give $$j\omega_0 L_s' << \frac{1}{j\omega_0 C_0} \qquad (15)$$

the following formula holds:

$$\frac{1}{\sqrt{L_s' C_s'}} = \frac{1}{\sqrt{(L_e + L_s') C_e}} = \omega_0 \qquad (16)$$

Then, the input current $I_{in}$ to the mechanical circuit is given by the following formula:

$$|I_{in}| = \frac{E_s}{\omega_0 L_s' \sqrt{\frac{16}{k'^4} r^4 + 8 \frac{(1-\gamma'^2)}{\gamma'^2 k'^2} r^2 + (1 + \frac{1}{Q'Q'_{eff}k'^2})^2}} \qquad (17)$$

where $Q' = \frac{\omega_0 L_s'}{R_{s1}' + R_{s2}'} \qquad (18)$ $$Q'_{eff} = \frac{\omega_0(L_s' + L_e)}{R_{in} + R_{s2}'} \qquad (19)$$

$$k'^2 = \frac{L_s'}{L_s' + L_e} \qquad (20)$$

$$\gamma'^2 = \frac{2Q'^2 Q'_{eff}{}^2 k'^2}{Q'^2 + Q'_{eff}{}^2} \qquad (21)$$

Thus, the form of formula (17) is identical with formula (7) and therefore the load characteristic, frequency characteristic and temperature characteristic of the output voltage can be improved as in the case of the embodiment shown in FIG. 2, if the circuit constants are selected so that the following conditions hold:

$$1 >> 1/Q'Q'_{eff}k'^2 \qquad (22)$$

$$0.5 < \gamma'^2 < 2 \qquad (23)$$

Now, a few embodiments of the auxiliary aspects of the present invention which make the present invention more useful will be described in the following paragraphs.

Curve 23 in FIG. 7 which indicates the frequency characteristics of the DC output voltage for the infinitely high load resistance 10 (FIG. 2), has a steep peak 29. Existence of such a steep peak is very dangerous and inconvenient for practical use, since it may break the insulation or mechanically damage the piezoelectric element if the frequency of the flyback pulse deviates from the normal frequency. Such a peak is caused by the resonance of the element the in $\lambda/2$ mode with the second harmonic of the flyback pulse frequency which has not been removed by the inductor 12 and the capacitor 13. Therefore, a primary method to remove such a peak is to prevent or suppress the $a/2$ mode resonance by some means.

FIGS. 10a, 10b, 10c and 10d show four different examples of some practical means for eliminating such a resonant vibration, according to which a portion of the piezoelctric element is pressed hard from opposite faces by bars 38 of a dielectric material such as propylene. In FIGS. 8a and 8b, reference numerals 30 and 31 indicate respectively the distribution of displacement and stress in the λ/2 mode vibration, 32 and 33 the same in the λ mode vibration, and 34 and 35 the positions of node in the distribution of displacement or loop in the distribution of stress in the λ mode resonance, said positions being approximately at ¼ and ¾ along the length of the element 1. By pressing hard the element at the above-mentioned position of the nodes as shown in FIGS. 10a, 10b, 10c and 10d, the vibration in λ/2 mode is remarkably suppressed as is seen from FIG. 8a while vibration in λ mode is hardly suppressed.

Figure 10A:
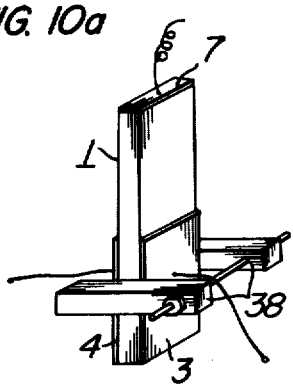
FIGS. 10a, 10b, 10c and 10d are isometric views showing the structure of the piezoelectric transformer used in the device of the present invention.
Figure 10C:
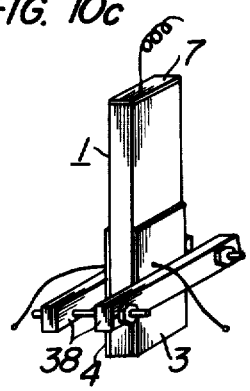
Figure 10B:
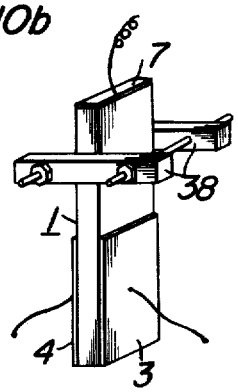
Figure 10D:
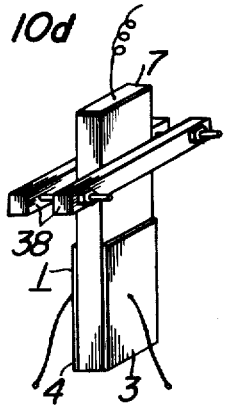
Figure 11:
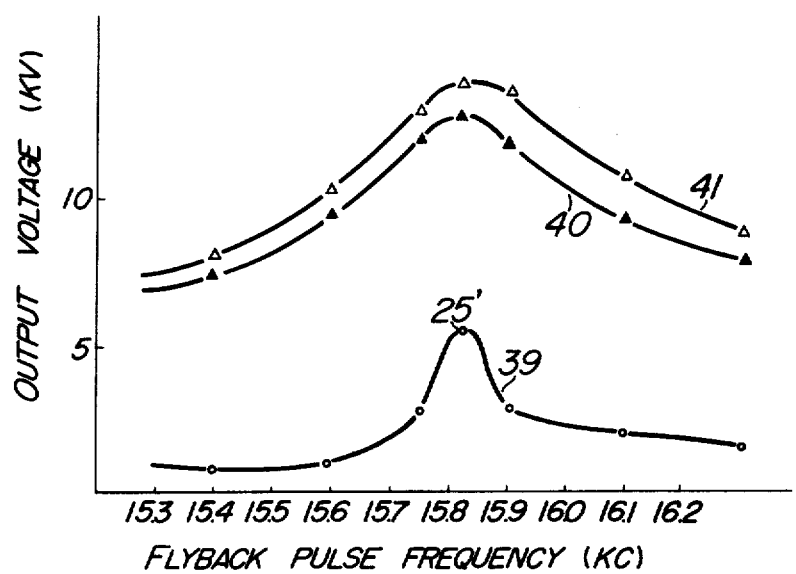
FIG. 11 is a diagram showing relations between the flyback pulse frequency and output voltage of the piezoelctric transformer as shown in FIGS. 10a to 10d.

In FIG. 11 which is used for explaining the above-described suppressing effect, curve 39 shows characteristic corresponding to curve 20 in FIG. 7 but in the case when the element 1 is pressed hard at the node of the λ mode resonant vibration as shown in FIGS. 10a to 10d. As is seen from curve 39, the resonant peak 24 due to the λ/2 mode has been completely extinguished. Curve 40 shows the frequency characteristics of the DC output voltage when the load resistnace is 68 Meg-ohms, and curve 41 shows the same when the load resistence is extremely high. In both cases, it will be seen that the curves do not have such a peak 29 as seen in FIG. 7.

Figure 12:
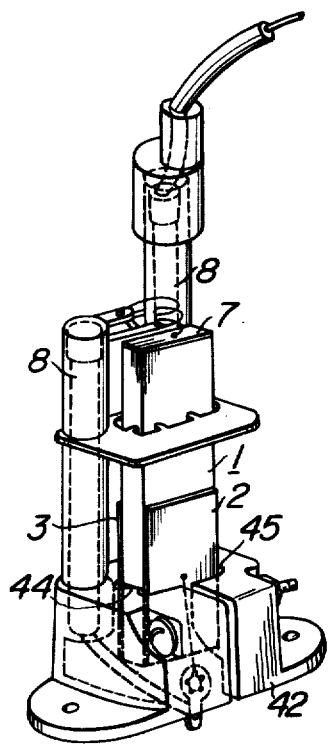

It will be understood that there may be various methods or means for pressing hard on the piezoelectric element 1. In FIG. 12 which shows an actual construction of the piezoelectric transformer pressed in the manner as shown in FIG. 10a, base 42 secures the piezoelectric element 1 and the diode 8 in respective posions and at the same time serves as the means to to press on the node of displacement in the driver portion of the element. Numerals 44 and 45 indicate protruded portions for pressing the element.

What is claimed is:

1. In a high voltage generating device comprising a piezoelectric transformer including two input drive electrodes on its driver portion, said input electrodes having an interelectrode capacitance $C_o$, and an output electrode on its generator portion; a rectifying and smoothing means connected to said output electrode for supplying a DC output voltage; and a variable frequency drive voltage signal source for driving said transformer, said device exhibiting a frequency versus DC output voltage characteristic having a peak portion including a maximum voltage generated substantially at a natural resonant frequency of the transformer when said transformer is driven over a predetermined frequency range from said voltage signal source, said transformer defining an equivalent series resonant circuit including a resonant inductance $L_e$ and a resonant capacitance $C_e$ at said natural resonant frequency; the improvement comprising:

an independent capacitor having a capacitance C connected between said drive electrodes, and an inductor having an inductance $L_s$ connected serially between said voltage signal source and said capacitor to form a series resonant having the relationship $$\frac{1}{\sqrt{L_s(C + C_o)}} = \frac{1}{\sqrt{L_e C_e}};$$

thereby producing a frequency versus input driving voltage characteristic having a double-humped shape over said predetermined frequency range for the voltage between said drive elctrodes, said double-humped characteristic having a valley-portion including a minimum voltage at about said resonant frequency to compensate for the peak-portion of said DC output voltage at said natural resonant frequency, whereby the resultant frequency versus effective DC output voltage characteristic of said device is flattened.

2. A high voltage generating device according to claim 1, wherein the capacitance of said independent capacitor C is extremely large in comparison with the interelectrode capacitance $C_o$.

3. A high voltage generating device according to claim 1, wherein said voltage signal source applys a substantially sinusoidal voltage across said intput drive electrodes.

4. A high voltage generating device according to claim 1, wherein said piezoelectric transformer is resonated at a higher harmonic of the frequency of said drive signal.

5. A high voltage generating device according to claim 1, wherein said piezoelectric transformer is resonated in the λ mode at a higher harmonic of the frequency of said drive signal.

6. A high voltage generating device according to claim 5, wherein said piezoelectric transformer has a rectangular-parallelepiped profile.

7. A high voltage generating device according to claim 5, wherein said device further includes means for exerting substantial pressure on said piezoelectric transformer at the position of the mode of displacement in the λ mode resonant vibration.

8. A high voltage generating device according to claim 7, wherein said means for exerting substantial pressure on said transformer includes means for supporting said piezoelectric transformer, and rectifiers comprising said rectifying means connected to the output electrode of said piezoelectric transformer.

9. A high voltage generating device according to claim 1, wherein said voltage signal comprises a horizontal flyback pulse voltage.

10. A high voltage generating device according to claim 9, wherein said horizontal flyback pulse voltage contains a fourth harmonic component for causing a resonance in the λ mode in said transformer at the natural resonant frequency.

11. In a high voltage generating device comprising a piezoelectric transformer having two input drive electrodes on its driver portion and an output electrode on its generator portion, a rectifying and smoothing means connected to said output electrode for supplying a DC output voltage, and a variable frequency drive voltage signal source for driving said transformer, said device exhibiting a frequency versus DC output voltage characteristic having a peak-portion including a maximum voltage generated substantially at a natural resonant frequency of the transformer when said transformer is driven over a predetermined frequency range from said voltage signal source; the improvement comprising:

an impedance conversion circuit comprising a series resonant circuit having first and second elements each having first and second terminals, the first terminals of said first and second elements being coupled to one of the input drive electrodes on the driver portion of said piezoelectric transformer, the second terminals of said first and second elements being coupled across the output of said voltage signal source and the other input drive electrode of said piezoelectric transformer being coupled to the second terminal of said second element, one of said first and second elements being an inductor and the other an independent capacitor, the series resonant circuit formed by said first and second elements resonanting substantially at said natural resonant frequency thereby producing a frequency versus input driving voltage characteristic for the voltage between said drive electrodes having a double-humped shape over said predetermined frequency range, said double-humped characteristic having a valley-portion including a minimum voltage at about said resonant frequency to compensate for the peak-portion of said DC output voltage at said natural resonant frequency, whereby the resultant frequency versus effective DC output voltage characteristic of said device is flattened.

12. A high voltage generating device according to claim 11, wherein said first element is said inductor and said second element is said independent capacitor.

13. A high voltage generator comprising:
a piezoelectric transformer having first and second input electrodes on its driver portion and an output electrode on its generator portion;
a variable frequency control voltage source having first and second output terminals,
an inductor having a self-inductance $L_s$ coupling the first input electrode of said piezoelectric transformer to the first output terminal of said control voltage source, said self-inductance causing a resonance in said transformer,
a capacitor having a high capacitance C relative to the input interelectrode capacitance $C_o$ of said transformer connected between the first and second input electrodes of said transformer, the capacitance C of said capacitor and the self-inductance $L_s$ of said inductor being related by the relation $$\frac{1}{\sqrt{L_s(C + C_o)}} = \frac{1}{\sqrt{L_e C_e}}$$

where $L_e$ is the equivalent resonant inductance of said piezoelectric transformer and $C_e$ is the equivalent resonant capacitance of said transformer, and
an output circuit for generating a high DC output voltage coupled between the output and second input electrodes of said piezoelectric transformer, the second input electrode of said transformer and the second output terminal of said control voltage source being connected together, the relative values of said self-inductance $L_s$ and capacitance C being such as to flatten the resultant frequency versus effective DC output voltage characteristic of said high voltage generator.

* * * * *